United States Patent
Wagner

(10) Patent No.: US 12,062,531 B2
(45) Date of Patent: Aug. 13, 2024

(54) METHOD AND SYSTEM FOR ADJUSTABLE COATING USING MAGNETRON SPUTTERING SYSTEMS

(71) Applicant: INTERPANE ENTWICKLUNGS—UND BERATUNGSGESELLSCHAFT MBH, Lauenfoerde (DE)

(72) Inventor: Dominik Wagner, Hoexter (DE)

(73) Assignee: INTERPANE ENTWICKLUNGS—UND BERATUNGSGESELLSCHAFT MBH, Lauenfoerde (DE)

( * ) Notice: Subject to any disclaimer, the term of this patent is extended or adjusted under 35 U.S.C. 154(b) by 149 days.

(21) Appl. No.: 17/311,963

(22) PCT Filed: Apr. 7, 2020

(86) PCT No.: PCT/EP2020/059868
§ 371 (c)(1),
(2) Date: Jun. 8, 2021

(87) PCT Pub. No.: WO2020/221563
PCT Pub. Date: Nov. 5, 2020

(65) Prior Publication Data
US 2022/0028673 A1    Jan. 27, 2022

(30) Foreign Application Priority Data

Apr. 29, 2019   (EP) .................................... 19171489

(51) Int. Cl.
*C23C 14/35*       (2006.01)
*H01J 37/34*       (2006.01)

(52) U.S. Cl.
CPC ............ *H01J 37/347* (2013.01); *C23C 14/35* (2013.01); *H01J 37/3405* (2013.01); *H01J 37/3455* (2013.01); *H01J 2237/332* (2013.01)

(58) Field of Classification Search
CPC .. H01J 37/347; H01J 37/3405; H01J 37/3455; H01J 37/32935; H01J 37/32972;
(Continued)

(56) References Cited

U.S. PATENT DOCUMENTS

| 2003/0085115 A1* | 5/2003 | Tani ...................... C23C 14/545 204/192.13 |
| 2009/0229970 A1 | 9/2009 | Itagaki et al. |

(Continued)

FOREIGN PATENT DOCUMENTS

DE    102014110001 A1    1/2016

*Primary Examiner* — Rodney G McDonald
(74) *Attorney, Agent, or Firm* — Potomac Technology Law, LLC

(57) ABSTRACT

A method and a system for adjustable coating on a substrate using a magnetron sputtering apparatus are provided. The method comprises the steps of providing a magnetron assembly which comprises a plurality of magnets attached to a plurality of yokes and a plurality of actuating mechanisms (208), each operatively coupled to at least one of the plurality of yokes. The method further comprises automatically determining individual positions of each of the plurality of yokes of the magnetron assembly on the basis of at least one parameter, and adjusting individually positions of each of the plurality of yokes of the magnetron assembly in accordance with the automatically determined individual positions.

16 Claims, 9 Drawing Sheets

(58) Field of Classification Search
CPC ............. H01J 37/3473; H01J 2237/332; H01J 37/3452; C23C 14/35; C23C 14/562
USPC ............... 204/298.2, 298.19, 298.03, 192.13
See application file for complete search history.

(56) References Cited

U.S. PATENT DOCUMENTS

2014/0246312 A1    9/2014  Crowley et al.
2017/0029940 A1*  2/2017  Van De Putte ..... H01J 37/3452

* cited by examiner

METHOD AND SYSTEM FOR ADJUSTABLE COATING USING MAGNETRON SPUTTERING SYSTEMS

RELATED APPLICATIONS

This application claims the benefit under 35 U.S.C. § 371 from PCT Application Serial No. PCT/EP2020/059868 (filed 2020 Apr. 7), which claims priority to the earlier filing date from European Patent Application No. 19171489.8 (filed 2019 Apr. 29), the entireties of which are incorporated herein by reference.

TECHNICAL FIELD

The present invention is in the field of magnetron sputtering coating deposition especially with rotating sputtering cathodes. More specifically, the invention refers to a method for coating on a wide variety of substrates, such as glass, having flat and non-flat surfaces, especially presenting a curvature in one or two dimensions.

BACKGROUND OF THE INVENTION

Magnetron sputtering with rotary cathodes has long been employed in the glass coating industry owing to its capability to maximize target material usage while creating uniform coating films. Control of coating uniformity with high precision during operation has a direct and crucial impact on substrate functionality and process costs.

The fast growing of thin film technologies leads to advanced coating applications with high requirements and narrow tolerances. These include applications involving non-planar substrates with complex surfaces.

Locally tailoring the magnetic field strength in magnetron sputtering with rotary cathodes offers a precise control of the target erosion and, hence, of the coating profile, paving the way for technological applications in coating non-flat substrates.

The patent application publication US 2014/0246312 A1 discloses a magnetron assembly for a rotary target cathode comprising an elongated support structure, a magnet bar structure movably positioned below the support structure, and a plurality of drive modules coupled to the support structure. Each of the drive modules includes a motorized actuation mechanism operatively coupled to the magnet bar structure. The magnet bar structure includes an array of substantially parallel rows of magnets attached to a single yoke.

The above-mentioned document, nevertheless, has the drawback that the shape of the magnet bar structure as a whole is modified by the actuation mechanisms. Since the magnets are attached to a single yoke, modification of the magnetic field essentially relies on bending the magnet bar. This restrains the precise control of the magnetic field shape and intensity in a specific location and therefore limits the possibility to precisely control the plasma intensity and the resulting coating profile which ultimately restricts the prospect of coating onto non-planar substrates.

In view of the above-mentioned problems and disadvantages, it is an object of the present invention to provide a method and a system for locally adjusting coating onto complex substrates with high quality and in an efficient manner using magnetron sputtering systems.

SUMMARY OF THE INVENTION

The object is achieved by the solution provided in the enclosed independent claims. Advantageous implementations of the present invention are further defined in the dependent claims.

According to the first aspect of the invention, a method for coating on a substrate using a magnetron sputtering apparatus is provided. The method comprises the steps of providing a magnetron assembly which in turn comprises a plurality of magnets attached to a plurality of yokes, and a plurality of actuating mechanisms, each operatively coupled to at least one of the plurality of yokes; automatically determining individual positions of each of the plurality of yokes of the magnetron assembly on the basis of at least one parameter; and adjusting individually positions of each of the plurality of yokes of the magnetron assembly in accordance with the automatically determined individual positions.

Advantageously, an accurate control of the magnetic field intensity and shape at specific positions can be achieved owing to the precise manipulation of the individual magnets and individual yokes, enabling to locally adjust a coating profile across complex substrates directly during operation of a magnetron sputtering apparatus. This enhances efficiency, saves time and reduces operation costs.

According to a first preferred implementation form of the first aspect of the invention, the at least one parameter defines a coating profile across a flat and/or a non-flat substrate. This is beneficial, since production of high quality complex coated substrates having a variety of applications is enabled.

According to a second preferred implementation form of the first aspect of the invention, the at least one parameter comprises at least one of a coating thickness at specific locations across a substrate, a magnetic field intensity at specific locations across a substrate, specific individual positions of the plurality of yokes, or any combination thereof. Advantageously, different parameters adapted to a respective use case are enabled.

According to a further preferred implementation form of the first aspect of the invention, the method further comprises setting the at least one parameter automatically on the basis of at least one measurement performed on the substrate preferably outside a sputtering apparatus. Advantageously, efficiency and precision are enhanced.

According to a further preferred implementation form of the first aspect of the invention, the at least one parameter is derived from individual optical transmission spectrums or individual optical reflection spectrums which are measured across or on a substrate, respectively, whereby the optical measurements are performed at locations corresponding to each of the plurality of yokes. Advantageously, this enables to analyse a wide variety of substrates and/or of coating materials used during production.

According to a further preferred implementation form of the first aspect of the invention, the magnetron assembly further comprises a master controller receiving the automatically determined individual positions of each of the plurality of yokes and sending them to a plurality of slave controllers in operative communication with a corresponding actuating mechanism. This is beneficial, since fully or partially automated control can be implemented, increasing precision and efficiency.

According to a further preferred implementation form of the first aspect of the invention, the plurality of actuating mechanisms are formed to be attached along an elongated support bar and are configured to displace the yokes individually away from and/or toward the elongated support bar in accordance with the automatically determined individual positions, whereby the displacement has a perpendicular component with respect to the elongated support bar. Advantageously, efficiency and precision are further enhanced.

According to a further preferred implementation form of the first aspect of the invention, the method further comprises the step of automatically determining a simulated coating profile on the basis of the automatically determined individual positions of the plurality of yokes, and displaying it on a display. Advantageously, this facilitates a user to determine whether additional adjustments of the yokes are required, saving time and increasing efficiency.

According to a further preferred implementation form of the first aspect of the invention, the method further comprises the optional steps of: determining and setting automatically at least one measured parameter on the basis of at least one measurement performed on the substrate after the plurality of yokes were displaced; automatically determining new individual positions of each of the plurality of yokes of the magnetron assembly on the basis of the at least one measured parameter; and adjusting individually positions of each of the plurality of yokes of the magnetron assembly in accordance with the new automatically determined individual positions.

Advantageously, this allows to further adjust locally a coating profile across complex substrates directly during operation of a magnetron sputtering apparatus. This enhances efficiency and reduces operation costs.

According to a further preferred implementation form of the first aspect of the invention, the at least one measured parameter is especially derived from individual optical transmission spectrums or individual optical reflection spectrums measured across or on a coated substrate respectively, whereby the optical measurements are performed at locations corresponding to each of the plurality of yokes. Advantageously, this enables to analyse a wide variety of substrates and/or of coating materials used during production.

According to a second aspect of the invention, a magnetron sputtering apparatus for coating on substrates is also provided. The sputtering apparatus comprises a magnetron assembly comprising a plurality of magnets attached to a plurality of yokes and a plurality of actuating mechanisms, each operatively coupled to at least one of the plurality of yokes; a controller in operative communication with the sputtering apparatus and comprising a processor, which is configured to automatically determine individual positions of each of the plurality of yokes on the basis of at least one parameter, wherein positions of each of the plurality of yokes of the magnetron assembly are adjusted individually by the actuating mechanisms in accordance with the individual positions automatically determined by the processor.

Advantageously, an accurate control of the magnetic field intensity and shape at specific positions can be achieved owing to the precise manipulation of the individual magnets and individual yokes, enabling to locally adjust a coating profile across complex substrates directly during operation of a magnetron sputtering apparatus. This enhances efficiency, saves time and reduces operation costs.

According to a first preferred implementation form of the second aspect of the invention, the at least one parameter defines a coating profile across a flat and/or a non-flat substrate. In addition to this or as an alternative, the at least one parameter comprises at least one of a coating thickness at specific locations across a substrate, a magnetic field intensity at specific locations across a substrate, specific individual positions of the plurality of yokes, or any combination thereof. This is beneficial, since production of high quality complex coated substrates having a variety of applications is enabled. Moreover, different parameters adapted to a respective use case can be provided.

According to a second preferred implementation form of the second aspect of the invention, the magnetron assembly further comprises a master controller receiving, from the external controller, individual positions of each of the plurality of yokes determined by the processor, and sending them to a plurality of slave controllers in operative communication with a corresponding actuating mechanism. In addition to this or as an alternative, the plurality of actuating mechanisms of the magnetron assembly are attached along an elongated support bar and displace the plurality of yokes individually away from and/or toward the elongated support bar in accordance with the determined individual positions, whereby the displacement has a perpendicular component with respect to the elongated support bar. This is beneficial, since fully or partially automated control can be implemented, increasing precision and efficiency.

According to a further preferred implementation form of the second aspect of the invention, the processor automatically determines a simulated coating profile on a substrate on the basis of the automatically determined individual positions of the plurality of yokes, and displays it on a display. Advantageously, this facilitates a user to determine whether additional adjustments of the yokes are required, saving time and increasing efficiency.

According to a further preferred implementation form of the second aspect of the invention, the at least one measured parameter is defined on the basis of at least one measurement performed on the substrate preferably outside the sputtering apparatus after the plurality of yokes have been displaced. In addition to this, or as an alternative, the at least one measured parameter is set automatically on the basis of the at least one measurement performed on the substrate. Additionally or alternatively, the processor automatically determines new individual positions of each of the plurality of yokes of the magnetron assembly on the basis of the at least one measured parameter. In addition or as an alternative, positions of each of the plurality of yokes of the magnetron assembly are adjusted individually by the actuating mechanisms in accordance with the new individual positions automatically determined by the processor.

Advantageously, this allows to further adjust locally a coating profile across complex substrates directly during operation of a magnetron sputtering apparatus. This enhances efficiency and reduces operation costs.

BRIEF DESCRIPTION OF THE DRAWINGS

Illustrative embodiments of the present invention are further explained by way of example only, and not for limitation, with respect to the accompanying drawings in which like reference numerals refer to similar elements. It is mentioned that the various features are not necessarily drawn to scale. In the drawings.

DETAILED DESCRIPTION OF THE INVENTION

The present invention will be described with respect to particular embodiments and with reference to certain drawings but the invention is not limited thereto. In the description and in the claims, the indefinite article a or an does not exclude a plurality. Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are generally employed for descriptive purposes and not necessarily for comprehensively describing exclusive relative positions. It is to be understood that any of the preceding terms so used may be interchanged under appropriate circumstances such that various embodiments of the invention described herein are capable of operation in other configurations and/or orientations than those described or illustrated herein.

The general sputtering apparatus will be described first, followed by the description of the inventive method in connection with particular examples.

Figure 1:
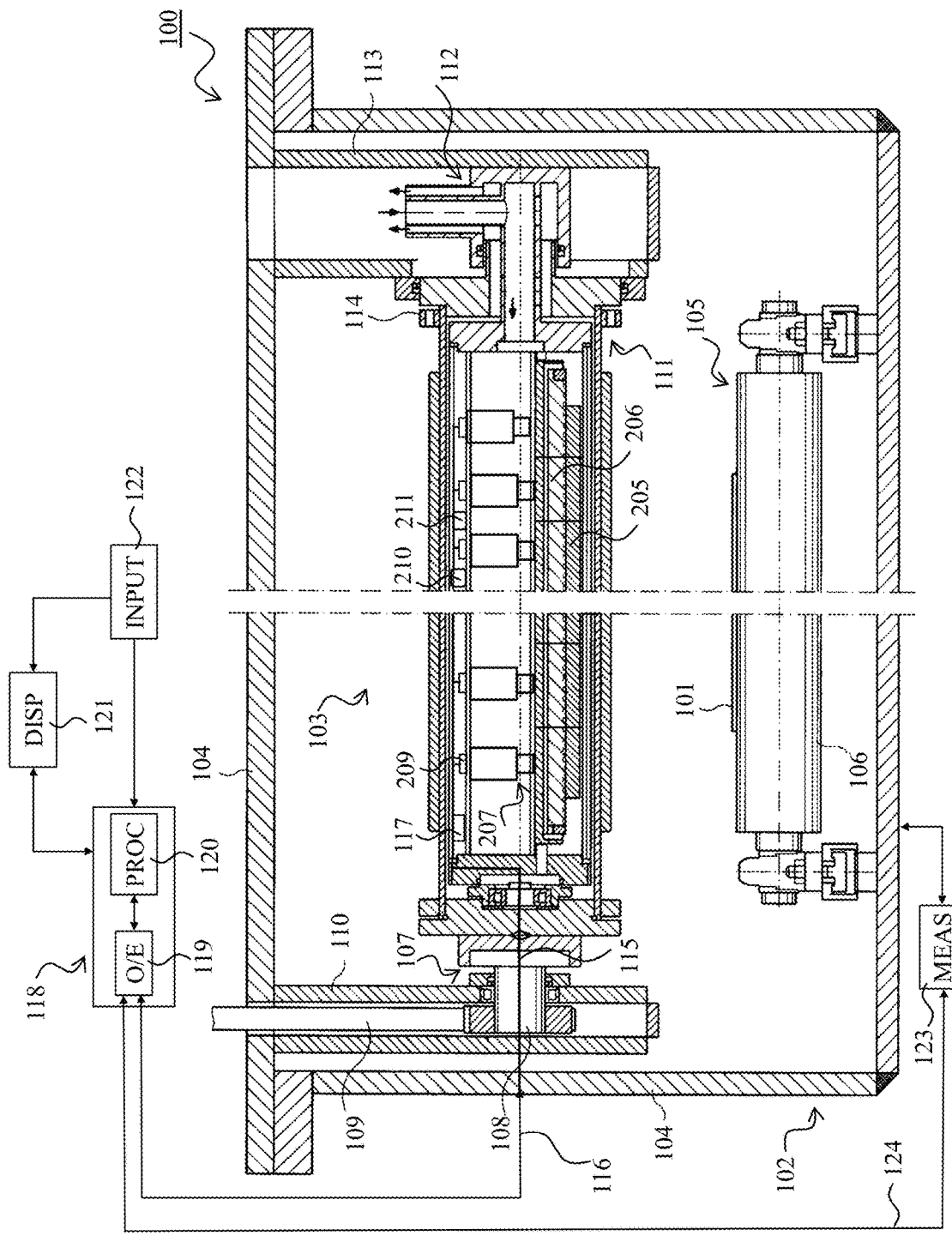
FIG. 1 shows a first embodiment of a sputtering apparatus, comprising a magnetron assembly with individual magnets attached to individual yokes, according to one aspect of the present invention.

Referring to FIG. 1, it shows an overall schematic representation of a sputtering apparatus 100 according to one embodiment of the invention, which is configured for magnetron sputtering with rotary cathodes. The sputtering apparatus 100 comprises a substrate 101 placed within a vacuum chamber 102 having an outer wall 104. The substrate 101 to be coated is guided to pass below a rotary cathode assembly 103 by using, for example, a conveyor 105 having a plurality of rollers 106. The substrate 101 refers to large-area substrates, for example glass but it is not limited to glass.

A first end 107 of the rotary cathode assembly 103 within the vacuum chamber 102 is rotatably attached, through a shaft 108, to a drive structure 109 that is adapted to rotate the rotary cathode assembly 103 and all its components, which will be described below in the description, about its main axis. The drive structure 109 may be embodied, for example, in the form of a toothed belt drive or motorized gears or the like mechanism. The vacuum chamber 102 is sealed with respect to a housing 110 supporting the drive structure 109.

As it can be noted in FIG. 1, a coolant fluid inlet and outlet 112 is provided at a second end 111 of the rotary cathode assembly 103. The coolant fluid inlet and outlet 112 can be arranged in a housing 113, which is sealed relative to the vacuum chamber 102. In addition to this, the second end 111 of the rotary cathode assembly 103 is rotatably attached, using a bearing 114, to the housing 113.

In this exemplary embodiment, the sputtering apparatus 100 enables transmission of light signals from outside the vacuum chamber 102 and/or to outside the vacuum chamber 102. The light signals are carried by at least one optical fiber 115 provided at the first end 107 of the rotatable target cathode assembly 103.

The at least one optical fiber 115 is coupled to at least one external optical fiber 116 outside the vacuum chamber 102, which in turn is in operative communication with a controller 118.

The controller 118 is coupled to a display 121, and comprises an optical-electrical converter 119 and a processor 120.

Figure 2A:
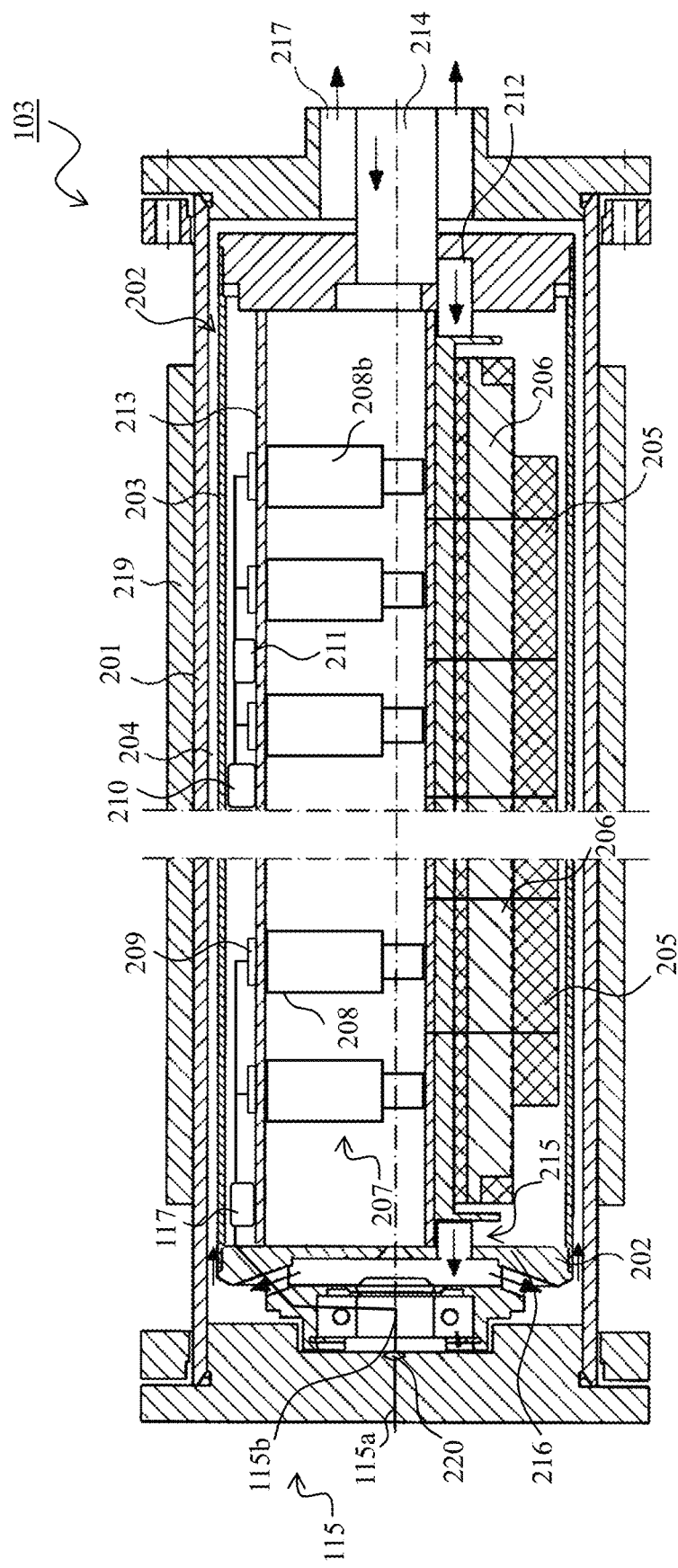
FIG. 2A shows the magnetron assembly placed within a rotary cathode assembly of the sputtering apparatus shown in FIG. 1.
Figure 2B:
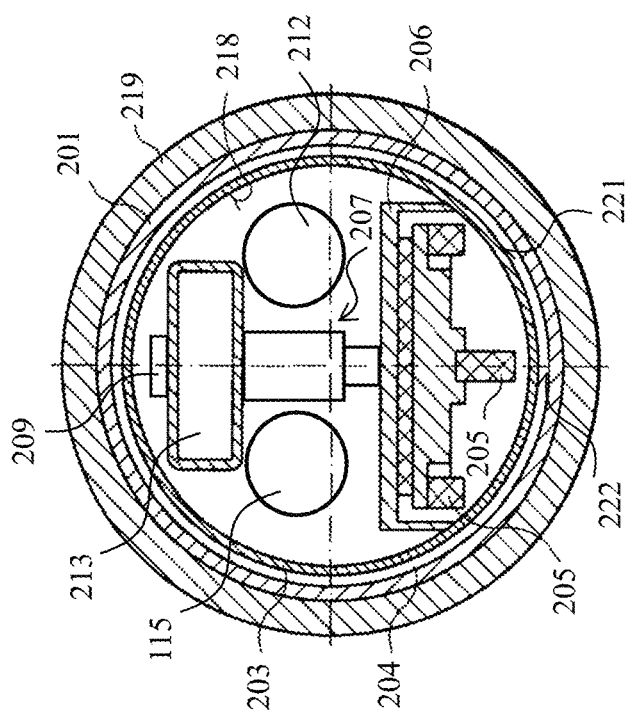
FIG. 2B is a sectional view of the magnetron assembly and the rotary cathode assembly of FIG. 2A.

FIGS. 2A and 2B illustrate the rotary cathode assembly 103 comprised within the sputtering apparatus 100, which comprises a magnetron assembly 202 having a protective tube 203 enclosed by a hollow target cathode 201, forming a passage 204 between the inner surface 222 of said hollow target cathode 201 and the outer surface 221 of the protective tube 203. The hollow target cathode also comprises a target material 219.

As it will be discussed in detail below, the magnetron assembly 202 comprises a plurality of magnets 205 attached to a plurality of yokes 206, a plurality of driving modules 207, a plurality of actuation mechanisms 208 provided by the driving modules 207, a plurality of slave controllers 209, a master controller 210, at least one rechargeable battery 211 and at least one cooling fluid pipe 212, which are placed within the protective tube 203.

From FIGS. 2A and 2B it is noted that the at least one cooling liquid pipe 212 may be attached to an elongated support bar 213 and placed along one side of the plurality of individual yokes 206.

Especially in the context of FIG. 2A, a cooling fluid is supplied to the at least one cooling fluid pipe 212 of the magnetron assembly 202, via an inlet 214 at the second end 111 of the rotary cathode assembly 103. The cooling fluid flows along the at least one cooling fluid pipe 212, in the direction depicted by the arrows shown in FIG. 2A, until it reaches a fluid guide 215 and exits through lateral bores 216 to the passage 204 formed between the outer surface 221 of the protective tube 203 of the magnetron assembly 202 and the inner surface 222 of the hollow target cathode 201.

Then, the coolant fluid flows through the passage 204 back to the second end 111 of the rotary cathode assembly 103, where it is discharged through an outlet 217. In this manner, the rest of the components of the magnetron assembly, namely the plurality of magnets 205, the plurality of individual yokes 206, the plurality of actuation mechanisms 207, the slave controllers 209, the central controller 210, the support bar 213 and the at least one rechargeable battery 211, are protected from corrosion owing to the coolant fluid while the hollow target cathode 201 and the target material 209 are kept appropriately cooled.

Also in the context of FIG. 2A, it is mentioned that the first end 107 of the rotary cathode assembly 103 comprises means for transferring light signals between the sputtering apparatus 100 and the magnetron assembly 202. In this embodiment, the at least one optical fiber 115 may comprise a static part 115a and a rotating part 115b, which are preferably coupled through a lens 220. Furthermore, the at least one optical fiber 115 as well as its static 115a and rotating 115b parts are sealed with respect to the coolant fluid reaching the fluid guide 215 and the lateral bores 216 at said first end 107, avoiding corrosion.

An exemplary embodiment of the magnetron assembly 202 will be discussed now especially with respect to FIG. 2B, which depicts a lateral view of the magnetron assembly 202 placed within the hollow target cathode 201 of the rotary cathode assembly 103.

As mentioned before, the magnetron assembly 202 comprises a plurality of magnets 205 attached to a plurality of yokes 206. In general, the magnets 205 are formed as substantially parallel rows of permanent magnets mounted on individual yokes 206, as shown in FIG. 2B. Each yoke 206 can be made of a metallic material, especially a ferromagnetic material as for example steel, and may be shaped in different forms, for example in a substantially "U" or "E" shape or any other shape that allows to accommodate the magnets 205.

The magnetron assembly 202 further comprises a plurality of driving modules 207. Each driving module 207 comprises an actuating mechanism 208 operatively coupled to at least one of the plurality of yokes 206. The plurality of driving modules 207 are adapted for adjusting the position of the plurality of yokes 206 individually.

In this exemplary embodiment, the plurality of driving modules 207, and therefore the plurality of yokes 206, are attached along an elongated support bar 213, so that the driving modules 207 displace the yokes 206 individually and essentially in a perpendicular manner with respect to the elongated support bar 213.

In this context, it is mentioned that the individual yokes 206 each can have a length, for example, between 100 mm and 300 mm, preferably between 100 mm and 200 mm, and their displacement can be, by way of example, between 5 mm and 30 mm, preferably 12 mm. The plurality of yokes 206 have not necessarily the same length, but each yoke 206 may have a different length. Moreover, the intensity of the magnetic field at each of the plurality of yokes 206 can be of the order of some milliteslas.

With regard to FIG. 2B, it is noted that when the magnetron assembly 202 having a protective tube 203 is placed within the hollow target cathode 203, each of the actuating mechanisms 208 displaces at least one of the yokes 206 towards the inner surface 218 of the protective tube 203 essentially in a perpendicular manner with respect to the elongated support bar 213. Alternatively, each of the actuating mechanisms 208 displaces at least one of the yokes 206 from the inner surface 218 of the protective tube 203 toward the elongated support bar 213, in an essentially perpendicular manner with respect to said elongated support bar 213.

Hence, such a displacement of the yokes 206 vary the distance of the magnets 205 to/from the hollow target cathode 201, enabling to locally control the intensity of a magnetic field generated by the magnets 205 which in turn modifies a generated plasma and therefore allows to control the coating uniformity when the rotary cathode assembly 201 is employed within a sputtering apparatus 100, as shown in FIG. 1.

As mentioned previously, the magnetron assembly 202 further comprises a plurality of slave controllers 209, each of which is in operative communication with a driving module 207. The plurality of slave controllers 209 are connected to a master controller 210. Especially, the master controller 210 is adapted to send and receive signals to and from outside the magnetron assembly 202, respectively, which are light signals carried by the at least one optical fiber 115, especially its rotating part 115b, which is passed through an optical-electrical signal converter 117. Alternatively, the magnetron assembly 202 may comprise a receiver (not shown) in one of its ends which is in optical communication directly with the optical fiber static part 115a or alternatively with the lens 220 and, thus, the optical fiber rotary part 115b and the optical-electrical converter 117 are rendered superfluous. This is beneficial, since complexity is reduced.

Moreover, each driving module 207, through a corresponding actuating mechanism 208, displaces the yokes 206 in accordance with signals received from the master controller 210 through a corresponding slave controller 209, sending a confirmation signal back to the master controller 210 after the corresponding yoke 206 has been displaced.

It is also mentioned that the master controller 210 may receive a signal from outside a sputtering apparatus 100, through at least an external optical fiber 116, which comprises information regarding any coating non-uniformities on a substrate 101 to be corrected by displacing at least one of the plurality of yokes 206. Additionally or alternatively, the master controller 210 may receive a signal from outside a sputtering apparatus 100, through the at least one external optical fiber 116, which comprises information regarding any coating profile on a substrate 101 to be controlled by displacing at least one of the plurality of yokes 206.

The at least one rechargeable battery 211, which is in operative communication with the driving modules 207, is configured to energize the actuation mechanisms 208, the slave controllers 209 and the master controller 210. Moreover, the at least one rechargeable battery 211 may be charged externally. This is beneficial, since charging and replacement of the at least one rechargeable battery 211 can be performed for example during equipment maintenance, saving time and operation costs. The battery 211 might alternatively be charged by an internal generator driven by a turbine rotated by the flow of the cooling fluid.

The actuating mechanisms 208 provided by the plurality of driving modules 207 may comprise at least one actuator 208b, which can be controlled separately from the other actuators.

The at least one actuator 208b can be implemented, for example, as a motorized actuator, a hydraulic actuator, a pneumatic actuator, a piezoelectric actuator or the like. In general, the at least one actuator 208b may also comprise at least one stopper (not shown) defining a maximum and a minimum displacement of a corresponding yoke 206 with respect to the elongated support bar 213. Such a maximum or minimum displacement may be determined in additional ways, for example by means counting the number of steps of the motor in the case that the at least one actuator is a step motor linear actuator, or by a predetermined light signal transmitted to/from outside a sputtering apparatus 100, or by other mechanisms.

The individually adjustable plurality of yokes 206 described above enable the sputtering apparatus 100 to achieve coating on a wide variety of substrates having flat or non-flat surfaces, for example substrates having a curvature in two- or three-dimensions, 2D and 3D respectively, with high quality as will be described now.

In this context, it is mentioned that a desired coating profile to be achieved with a sputtering apparatus 100 may be defined by at least one parameter. Such at least one parameter may comprise, for example, at least one of a coating thickness at specific locations across the substrate 101, a magnetic field intensity at specific locations across the substrate 101, specific individual positions of the plurality of yokes 206, or any combination thereof. By way of further example, the at least one parameter may comprise information regarding the shape of the substrate surface, exemplary a parabolic shape or a box shape or the like shape.

Moreover, the at least one parameter can be provided manually to the controller 118 on the basis of at least one user input set through an input device 122, as exemplary shown in FIG. 1.

It is preferred, though, that the at least one parameter is set automatically on the basis of at least one measurement performed on the substrate 101 preferably outside the sputtering apparatus 100. Said measurement is performed by a measuring unit 123 which is operatively coupled to the controller 118 through, for example, an optical fiber 124. Additionally or alternatively, the measurements can be performed inside the sputtering apparatus 100.

Figure 3:
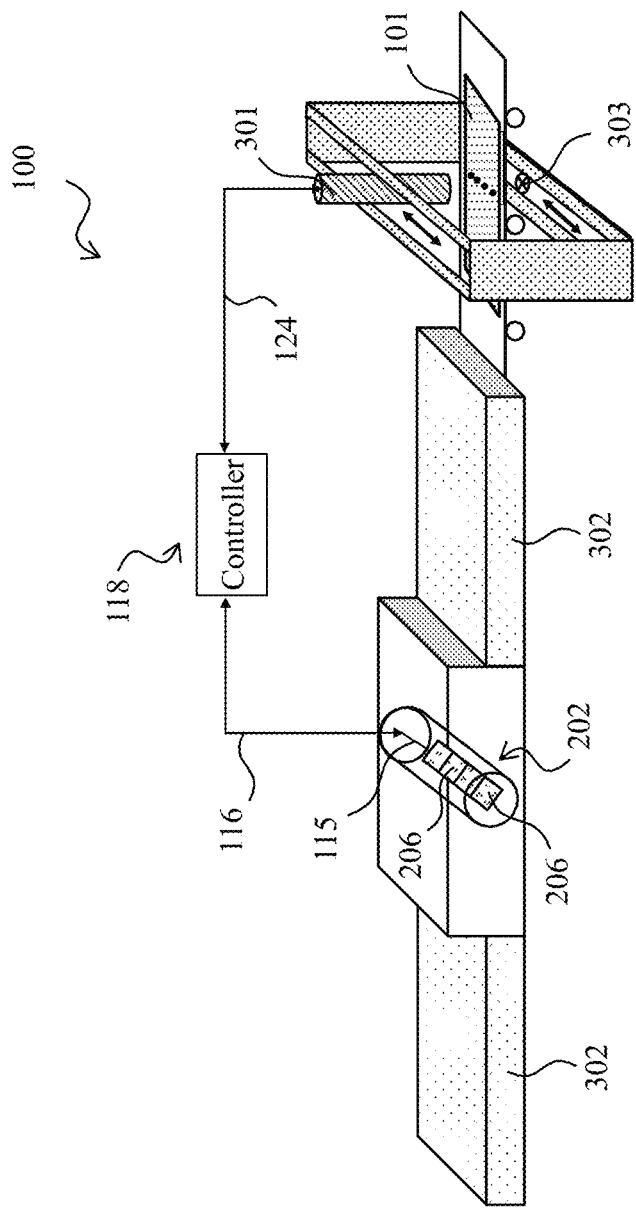
FIG. 3 depicts an exemplary embodiment of the sputtering apparatus in which an optical measurement is performed onto a coated substrate.

In this context, FIG. 3 depicts a second embodiment of the sputtering apparatus 100 in accord with the present invention, in which it is illustrated how the substrate passes through the sputtering apparatus 100 through air lockers 302. Moreover, in FIG. 3 it is exemplified that the measurement unit 123 may comprise an optical spectrometer 301 with a light source 303. The optical spectrometer 301 performs individual measurements on or across the substrate 101, preferably outside the sputtering apparatus 100. In particular, as it can be observed from FIG. 3, the optical measurements are performed along the width of the substrate 101, at individual locations which especially correspond to each of the plurality of yokes 206 within the magnetron assembly 202.

Then, individual optical transmission spectrums or individual optical reflection spectrums are measured on or across a substrate 101, respectively, for each yoke 206 within the magnetron assembly 202. The at least one parameter defining a coating profile on the substrate 101 is then derived from the individual optical spectrums generated by the optical spectrometer 301, and is automatically provided to the controller 118 through the optical fiber 124. For the sake of clarity, not all the details of the sputtering machine 100 or the controller 118 are shown here.

In the context of FIG. 1 to FIG. 3, the controller 118 supplies the at least one parameter to the processor 120. It is noted that, in the case that said at least one parameter is automatically determined through the optical fiber 124, it is passed first through the optical-electrical converter 119, which in turn is connected to the processor 120.

Then, the processor 120 is configured to automatically determine individual positions of each of the plurality of yokes 206 of the magnetron assembly on the basis of the at least one parameter. In this manner, the coating profile defined by said parameter is achieved by locally adjusting the magnetic field intensity generated by the plurality of magnets 205 attached to the yokes 206.

With the aid of the optical-electrical converter 119, a signal comprising the determined positions of the yokes 206 is sent from the controller 118 to the magnetron assembly 202 through the at least one external optical fiber 116. The master controller 210 within the magnetron assembly 202 receives said signal through the at least one optical fiber 115, as explained before, and sends it to the plurality of slave controllers 209, which in turn are in operative communication with the plurality of driving modules 207. Then, each of the driving modules 207, through the corresponding actuating mechanisms 208, displace each of the plurality of yokes 206 of the magnetron assembly 202 in accordance with the received signal comprising the positions, yielding a desired coating profile onto the substrate 101.

Moreover, in the context of FIG. 1, the processor 120 automatically simulates a coating profile on the basis of the automatically determined individual positions of the plurality of yokes 206, which is further displayed on a display 121. The simulated coating profile may be displayed, for example, in the form of a plot of the coating thickness as a function of the elongated support bar 213 length or as a function of the substrate length. Additionally or alternatively, the displacement of the individual yokes as a function of the substrate length or as a function of the elongated support bar 213 length can also be displayed.

After the plurality of yokes 206 have been displaced, the process described above can be repeated, for example, in the case that coating non-uniformities across the substrate 101 are detected, or to further displace the individual yokes 206 especially in the case that the substrate 101 have a non-flat shape in two or three dimensions.

In this context, a measurement is performed on the substrate 101, inside or preferably outside the sputtering apparatus 100. Then, at least one measured parameter defining a coating profile on the substrate 101 is determined on the basis of said measurement.

The at least one measured parameter can be set manually, by at least one user input set through the input device 122. Preferably or additionally, the at least one measured parameter is determined automatically from the measurement performed on the substrate 101. Such a measurement may especially comprise individual optical transmission spectrums or individual optical reflection spectrums measured across or on a coated substrate 101 respectively, by an optical spectroscope 301, as depicted in FIG. 3, whereby the optical measurements are performed at locations corresponding to each of the plurality of yokes 206 within the magnetron assembly 202. The at least one measured parameter is especially derived from the individual optical spectrums.

Then, on the basis of the at least one measured parameter, the processor 120 automatically determines new individual positions of each of the plurality of yokes 206 of the magnetron assembly 202 that are subsequently sent to the plurality of driving modules 208, through the slave controllers 209 and the master controller 210, as explained before. Each of the driving modules 208 adjusts individually the positions of each of the plurality of yokes 206 in accordance with the new automatically determined individual positions.

Figure 4:
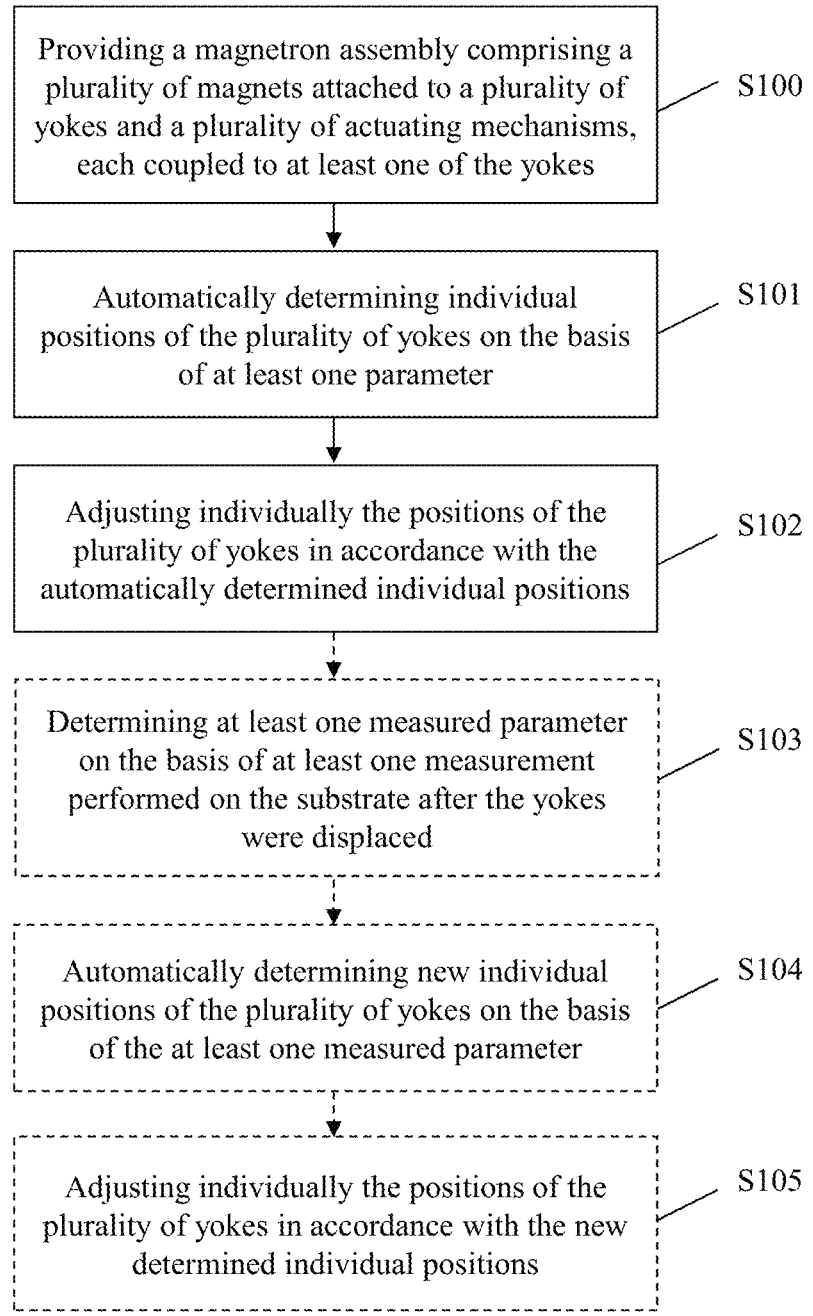
FIG. 4 shows a flow chart of a representative embodiment of the inventive method according to another aspect of the invention.

Now, FIG. 4 shows a flow chart of an exemplary embodiment of the inventive method according to another aspect of the invention. In a first step S100, a magnetron assembly 202 is provided. The magnetron assembly 202, which may be placed within a rotary cathode assembly 103, comprises especially a plurality of magnets 205 attached to a plurality of yokes 206, and a plurality of actuating mechanisms 208, each operatively coupled to at least one of the plurality of yokes 206.

In a second step S101, individual positions of each of the plurality of yokes 206 of the magnetron assembly 202 are automatically determined on the basis of at least one parameter. Then, in step S102, the positions of each of the plurality of yokes 206 are adjusted individually, in accordance with the automatically determined individual positions.

The at least one parameter defines a coating profile across a substrate 101, which can be either a flat substrate, additionally or alternatively a non-flat substrate, and may comprise for example a coating thickness at specific locations across a substrate, or a magnetic field intensity at specific locations across a substrate, or specific individual positions of the plurality of yokes 206, or any combination thereof.

The inventive method further comprises setting the at least one parameter manually by at least one user input set through an input device 122. As explained before, the at least one parameter is preferably determined and set in an automatic manner on the basis of at least one measurement performed on the substrate 101. Such at least one measurement can be performed inside the sputtering apparatus 100 or preferably outside the sputtering apparatus 100.

The measurement may comprise, for example, individual optical transmission spectrums or individual optical reflection spectrums which are measured across or on a substrate 101, respectively, by an optical spectrometer 301 whereby the optical measurements are performed at locations corresponding to each of the plurality of yokes 206.

Moreover, the magnetron assembly 202 further comprises a master controller 210 receiving the automatically determined individual positions of each of the plurality of yokes 206, and sending them to a plurality of slave controllers 209 in operative communication with a corresponding actuating mechanism 208. In this context, it is emphasized that the plurality of actuating mechanisms 208 are formed to be attached along an elongated support bar 213 and, moreover, are configured to displace the yokes 206 individually away from and/or toward the elongated support bar 213 in accordance with the determined individual positions. Whereby the displacement preferably has a perpendicular component with respect to the elongated support bar 213.

The method further comprises the step of automatically determining a simulated coating profile on the basis of the determined individual positions of the plurality of yokes 206. The simulated profile is then displayed on a display 121. Advantageously, from the displayed coating profile it is possible for a user to identify whether additional adjustments of the yokes are required, especially if the substrate 101 has a complex, non-flat surface on two- or three-dimensions.

The inventive method further comprises the optional steps of determining and setting S103, manually or preferably automatically, at least one measured parameter on the basis of at least one measurement performed on the substrate 101, either inside or preferably outside the sputtering apparatus 100, after the plurality of yokes were displaced. In a next step S104, new individual positions of each of the plurality of yokes 206 of the magnetron assembly 202 are automatically determined on the basis of the at least one measured parameter.

In a subsequent optional step S105, positions of each of the plurality of yokes 206 of the magnetron assembly 202 are adjusted individually, in accordance with the new automatically determined individual positions.

As it has been explained before in the context of FIG. 3, the at least one measured parameter is especially derived from individual optical transmission spectrums or individual optical reflection spectrums measured across or on a coated substrate 101, respectively, by an optical spectrometer 301, whereby the optical measurements are performed at locations corresponding to each of the plurality of yokes 206.

In addition to the explanations above, the invention should especially be discussed with respect to the exemplary simulated results depicted in FIGS. 5A to 8. In the simulations, a target to substrate distance of 140 mm is considered. The exemplary graphs shown in each of FIGS. 5A to 8 includes three plots. One of the plots is the normalized coating thickness as a function of the length of the support bar 213, for a specific number of yokes and for different substrates. A plot of the substrate profile to be coated as a function of the length of the support bar 213 is also shown. In addition to this, a third plot represents the displacement of the yokes attached along the elongated support bar 213 through a corresponding actuating mechanism 208, i.e. representing the configuration used for the yokes in the magnetron assembly 202. It is also mentioned that in FIGS. 5A to 8, the left vertical axis represents the displacement of the yokes, in which 4 units represent a displacement of 1 mm.

Figure 5A:
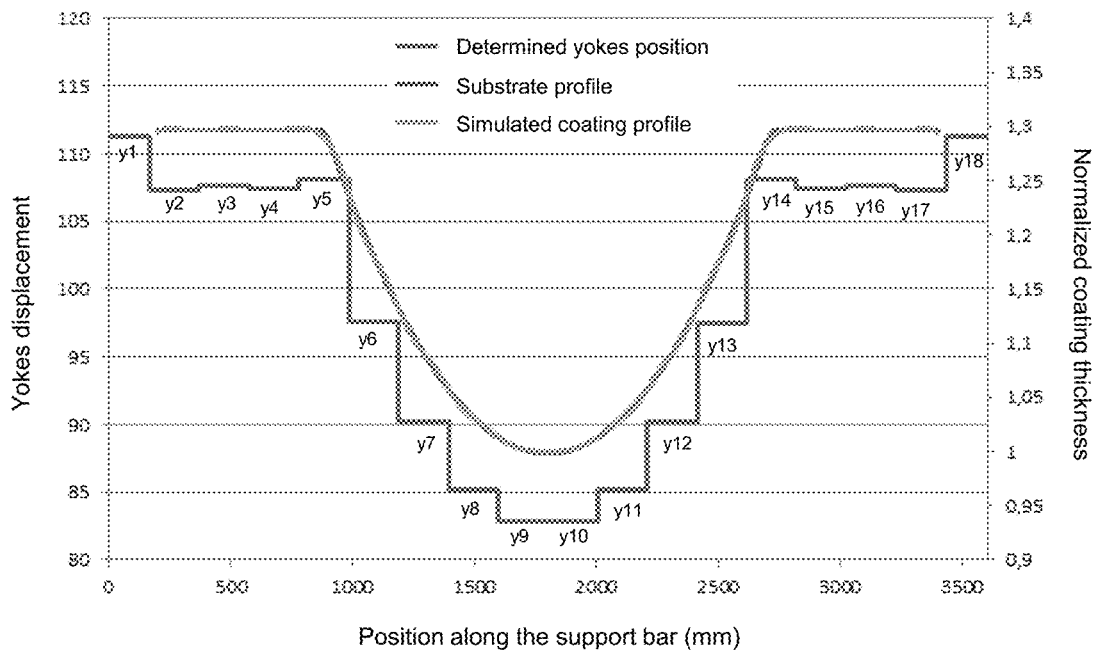
FIG. 5A shows an exemplary simulated coating profile for a parabolic-shaped substrate obtained by considering 18 adjustable yokes, in accordance with the present invention.

As a first example, in FIG. 5A it is considered that a substrate with a parabolic surface will be coated using 18 yokes, each with a length of 200 mm. The at least one parameter set to the controller 118 defines such a parabolic shape. Then, the processor 120 automatically determines the individual positions for each of the yokes 206. Each position refers to a displacement of the corresponding yoke 206 with respect to the elongated support bar 213, with the magnitude of the displacement indicated in the left axis. For the sake of clarity, each yoke is numbered from y1 to y18 within the graph in this example, to illustrate the way in which the yokes are arranged along the supporting bar 213 within the magnetron assembly 202.

The individual target displacements of the yokes are transferred, in the form of a light signal carried by the external optical fiber 116, to the master controller within the magnetron assembly 202, and from it to the plurality of actuating mechanisms 208 through the slave controllers 209. The actuating mechanisms 208, then, displace the yokes 206 in accordance with the positions depicted in FIG. 5A.

The processor 210 further determines, in an automatic manner, the coating profile obtained with the determined positions (or displacements), which is shown in the form of the normalized coating thickness plotted in FIG. 5A, where it is observed that the simulated coating profile expected to be obtained after the yokes are displaced, corresponds closely to the parabolic surface of the substrate.

Figure 5B:
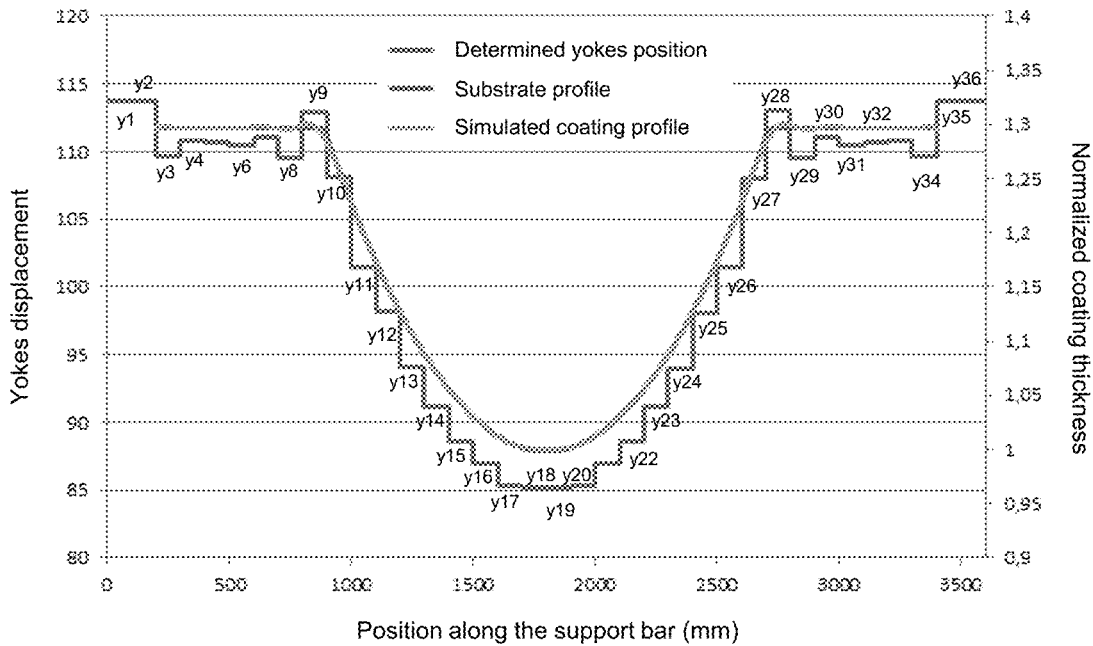
FIG. 5B shows an exemplary simulated coating profile for a parabolic-shaped substrate obtained by considering 36 adjustable yokes, in accordance with the present invention.

In FIG. 5B the same parabolic substrate is considered, using 36 yokes, y1 to y36, each with a length of 200 mm. The automatically determined positions of the yokes 206 and the simulated normalized coating thickness are also shown. As in FIG. 5A, FIG. 5B reveals that a complex, non-flat substrate can be coated by individually adjusting the displacement of the 36 individual yokes.

Figure 6A:
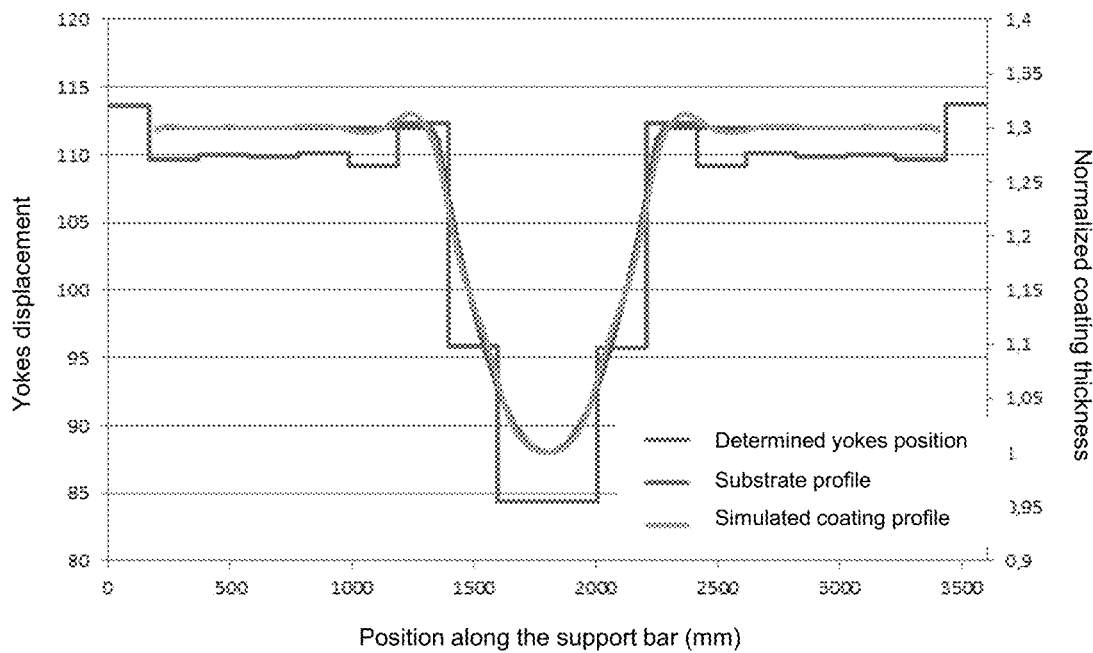
FIG. 6A shows an exemplary simulated coating profile for a narrow parabolic-shaped substrate obtained by considering 18 adjustable yokes, in accordance with the present invention.
Figure 6B:
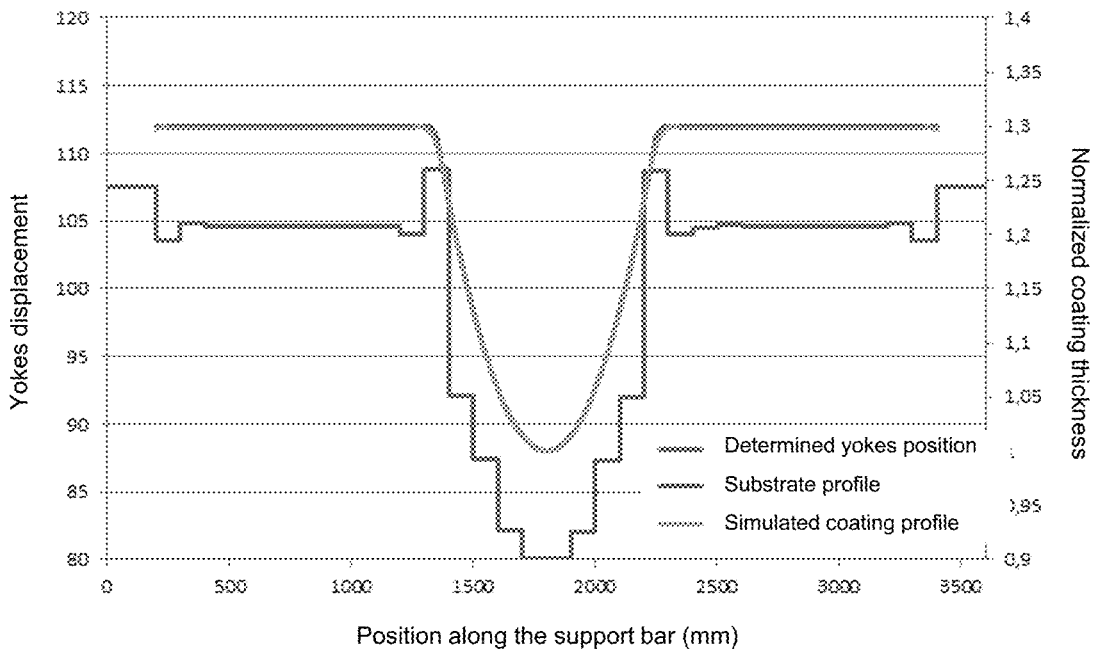
FIG. 6B shows an exemplary simulated coating profile for a narrow parabolic-shaped substrate obtained by considering 36 adjustable yokes, in accordance with the present invention.

As a second example, in FIGS. 6A and 6B a substrate with a narrow parabolic shape is considered using 18 yokes with length of 200 mm (FIG. 6A) and 36 yokes with 100 mm length (FIG. 6B). It is noted that the determined individual positions of the yokes used in FIG. 6B results in a coating thickness that follows the substrate surface in a more precise manner than in FIG. 6A.

Figure 7A:
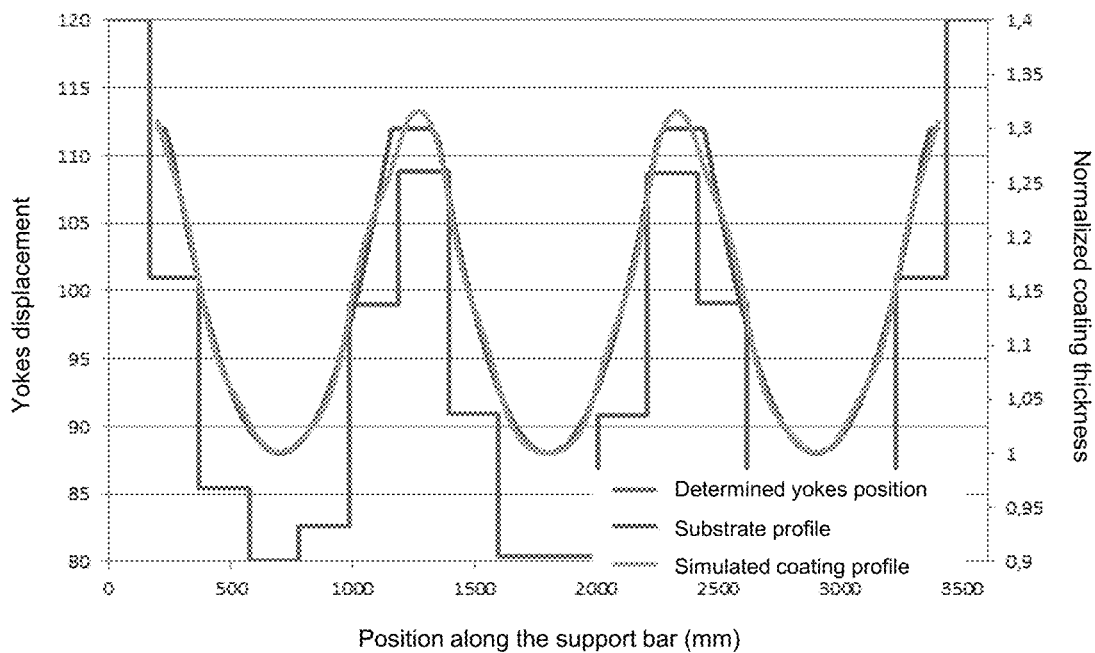
FIG. 7A shows an exemplary simulated coating profile for a triple parabolic-shaped substrate obtained by considering 18 adjustable yokes, in accordance with the present invention.
Figure 7B:
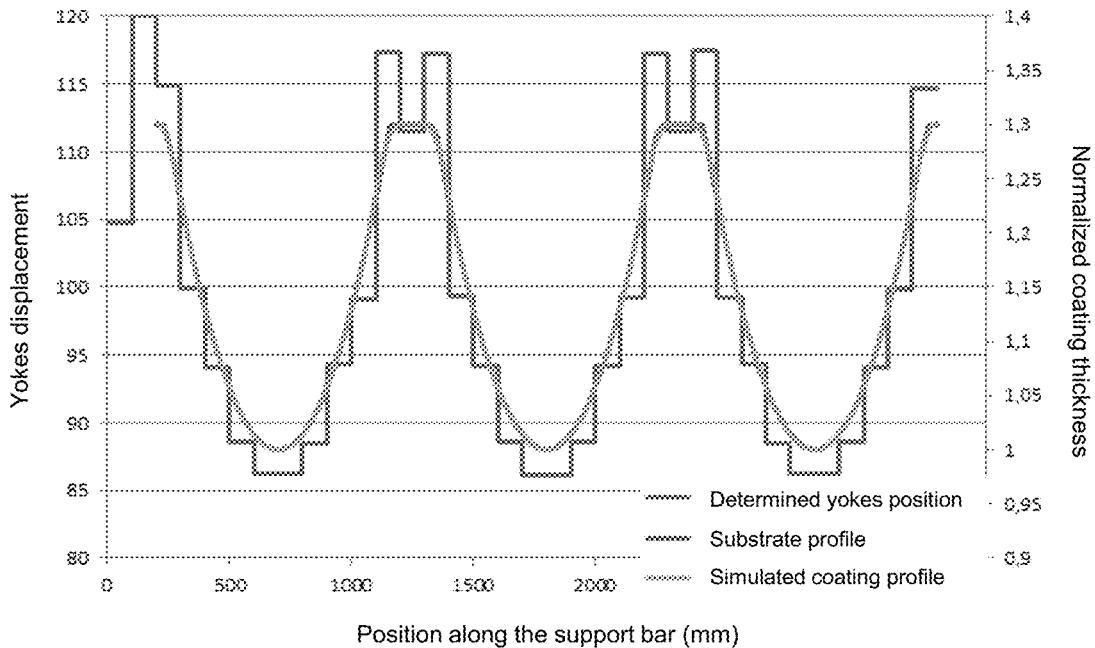
FIG. 7B shows an exemplary simulated coating profile for a triple parabolic-shaped substrate obtained by considering 36 adjustable yokes, in accordance with the present invention.
Figure 7C:
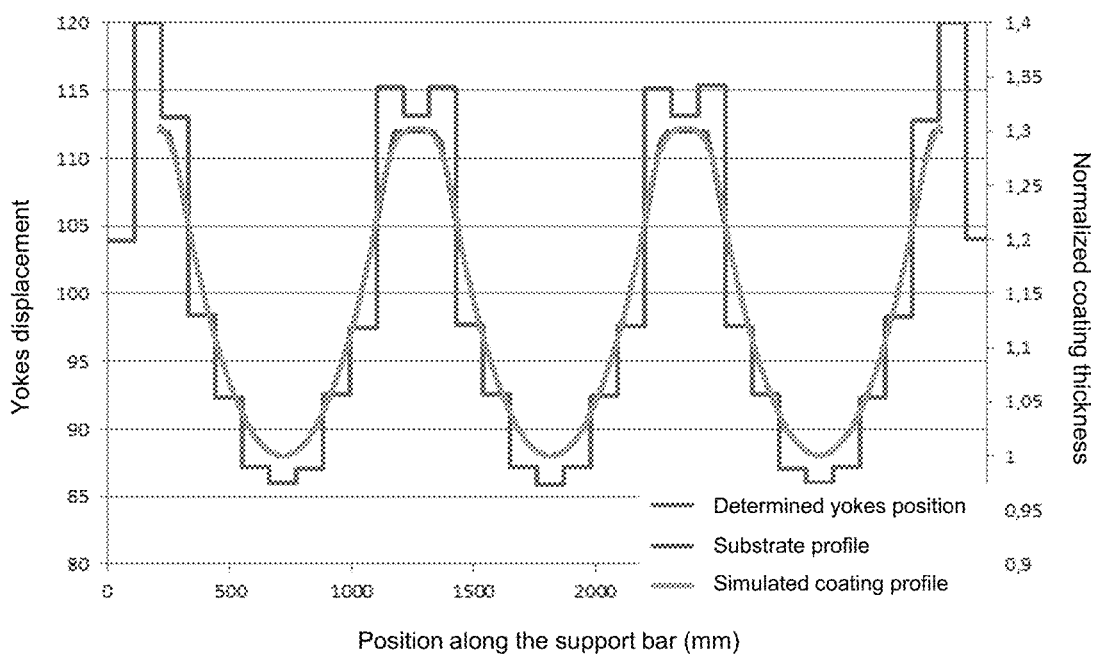
FIG. 7C shows an exemplary simulated coating profile for a triple parabolic-shaped substrate obtained by considering 33 adjustable yokes, in accordance with the present invention.

As a further example, FIGS. 7A to 7C consider a complex substrate having a surface with three neighbouring parabolas. In FIG. 7A, 18 yokes with length of 200 mm are used. FIG. 7B considers 36 yokes with 100 mm length, and in FIG. 7C 33 yokes with 100 mm length are used. It is noted that the number and size of individual yokes employed in FIGS. 7B and 7C result in almost the same performance for the simulated normalized coating thickness.

Figure 8:
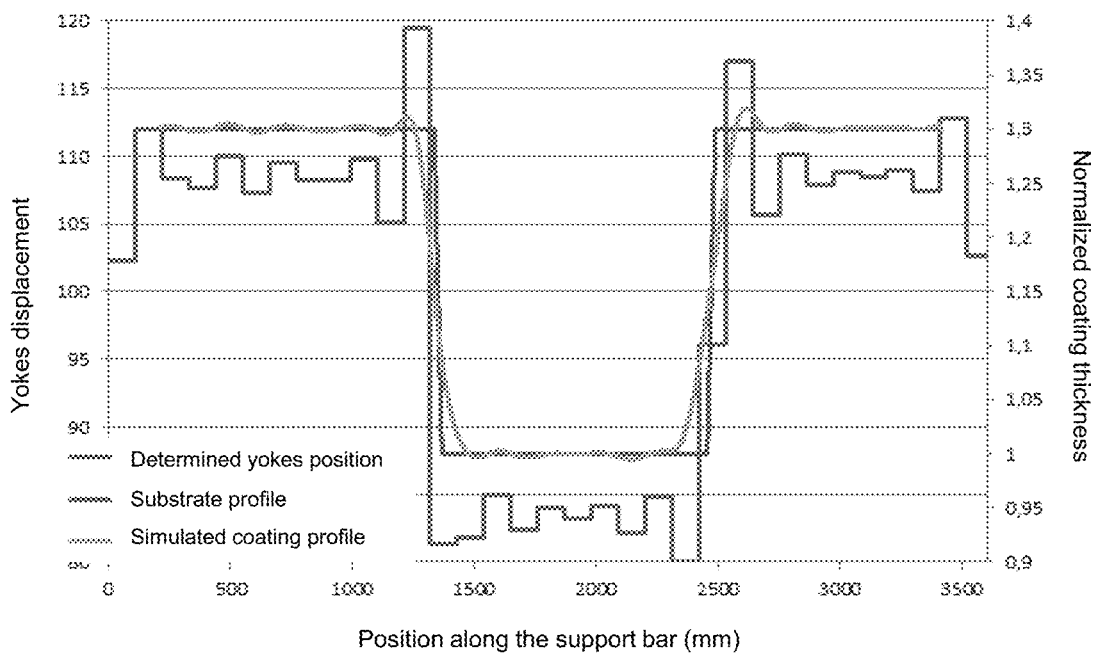
FIG. 8 shows an exemplary simulated coating profile for a box-shaped substrate obtained by considering 33 adjustable yokes, in accordance with the present invention.

Different substrate shapes can also be coated in the context of the present invention, as shown in FIG. 8 in which coating of substrate with a box shaped surface is considered using 33 yokes, each having 100 mm length. From the simulated normalized coating thickness shown here, it can be noted that a further automatic adjustment of the individual positions of the yokes may be required in order to enhance the coating profile quality.

The examples illustrated in FIGS. 5A to 8 can conversely refer to flat substrates on top of which a structured coating is achieved, for example a parabolic coating as in FIGS. 5A to 6B, a triple parabolic coating as in FIGS. 7A to 7C or a box-shaped coating as in FIG. 8. Such coating shapes can be obtained by an equivalent displacement of the yokes as automatically determined in each of said examples on the basis of at least one parameter.

Hence, the exemplary graphs shown in FIGS. 5A to 8 illustrate the advantageous capabilities of the inventive method and inventive system to individually adjust the plurality of yokes 206 in order to control a coating profile onto flat and shaped substrates.

Finally, it is mentioned that throughout the present disclosure it is not excluded that an actuating mechanism 208 may also be adapted to displace groups of yokes 206 at a time. Also, it is not excluded that more than one actuating mechanism 208 may be adapted to displace a single yoke 206. By way of example, two or more yokes 206 can be displaced simultaneously by an actuating mechanism 208, or any combination thereof.

While various embodiments of the present invention have been described above, it should be understood that they have been presented by way of example only, and not limitation. Numerous changes to the disclosed embodiments can be made in accordance with the disclosure herein without departing from the scope of the invention. Thus, the breadth and scope of the present invention should not be limited by any of the above described embodiments. Rather, the scope of the invention should be defined in accordance with the appended claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The invention claimed is:

1. A method for coating a substrate using a magnetron sputtering apparatus which includes a magnetron assembly, the method comprising:
automatically determining individual positions of each of a plurality of yokes of the magnetron assembly on the basis of at least one parameter;
individually adjusting positions of each of the plurality of yokes of the magnetron assembly in accordance with the automatically determined individual positions; and
providing signals, by a master controller within the magnetron assembly, to a plurality of slave controllers within the magnetron assembly, each slave controller being in operative communication with a corresponding driving module, wherein each driving module is configured to control the adjustment of a respective one of the plurality of yokes, via a respective actuating mechanism, in accordance with the signals from the master controller, and to send a confirmation signal back to the master controller after the adjustment of the respective one of the plurality of yokes.

2. The method according to claim 1, wherein the at least one parameter defines a coating profile across a flat and/or a non-flat surface of the substrate.

3. The method according to claim 1, wherein the at least one parameter comprises at least one of a coating thickness at specific locations across the substrate, a magnetic field intensity at specific locations across the substrate, specific individual positions of the plurality of yokes, or any combination thereof.

4. The method according to claim 1, wherein the method further comprises setting the at least one parameter automatically on the basis of at least one measurement performed on the substrate.

5. The method according to claim 1, wherein the at least one parameter is derived from individual optical transmission spectrums measured across the substrate or individual optical reflection spectrums measured on the substrate, whereby the optical measurements are performed at locations corresponding to each of the plurality of yokes.

6. The method according to claim 1, wherein the method further comprises the steps of providing the master controller with the automatically determined individual positions of each of the plurality of yokes and sending them to the plurality of slave controllers each being in operative communication with a corresponding actuating mechanism.

7. The method according to claim 1, wherein the plurality of actuating mechanisms are positioned along an elongated support bar, and wherein the plurality of yokes are individually adjusted by the plurality of actuating mechanisms away from and/or toward the elongated support bar in accordance with the automatically determined individual positions of each of the plurality of yokes, whereby the displacement has a perpendicular component with respect to the elongated support bar.

8. The method according to claim 1, wherein the method further comprises the steps of automatically determining a simulated coating profile for the substrate on the basis of the automatically determined individual positions of each of the plurality of yokes, and displaying the simulated coating profile on a display.

9. The method according to claim 1, wherein the method further comprises the steps of:
automatically determining at least one measured parameter on the basis of at least one measurement performed on the substrate after the adjustment of the plurality of yokes;
automatically determining new individual positions of each of the plurality of yokes of the magnetron assembly on the basis of the at least one measured parameter; and individually adjusting positions of each of the plurality of yokes of the magnetron assembly in accordance with the new individual positions of each of the plurality of yokes.

10. The method according to claim 9, wherein the at least one measured parameter is derived from individual optical transmission spectrums measured across, or individual optical reflection spectrums measured on, the substrate, whereby the optical measurements are performed at locations corresponding to each of the plurality of yokes.

11. A magnetron sputtering apparatus for coating a substrate, the magnetron sputtering apparatus comprising:
a magnetron assembly, which comprises a plurality of magnets attached to a plurality of yokes, and a plurality of actuating mechanisms, each operatively coupled to at least one of the plurality of yokes; and
a controller in operative communication with the magnetron sputtering apparatus and configured to automatically determine individual positions of each of the plurality of yokes on the basis of at least one parameter;
wherein the actuating mechanisms are configured to individually adjust positions of each of the plurality of yokes in accordance with the automatically determined individual positions of each of the plurality of yokes, and
wherein the magnetron assembly further comprises a master controller and a plurality of slave controllers, wherein the master controller is within the magnetron assembly and is configured to provide signals to the plurality of slave controllers, wherein each of the slave controllers is within the magnetron assembly and is in operative communication with a corresponding driving module, and wherein each driving module is configured to control the adjustment of a respective one of the plurality of yokes via a respective actuating mechanism in accordance with the signals from the master controller, and to send a confirmation signal back to the master controller after the adjustment of the respective one of the plurality of yokes.

12. The magnetron sputtering apparatus according to claim 11,
wherein the at least one parameter defines a coating profile across a flat and/or a non-flat surface of the substrate, and/or
wherein the at least one parameter comprises at least one of a coating thickness at specific locations across the substrate, a magnetic field intensity at specific locations across the substrate, specific individual positions of the plurality of yokes, or any combination thereof.

13. The magnetron sputtering apparatus according to claim 11,
wherein the master controller is configured to receive the individual positions of each of the plurality of yokes and to send them to the plurality of slave controllers each being in operative communication with a corresponding actuating mechanism, and/or
wherein the plurality of actuating mechanisms are positioned along an elongated support bar and are configured to displace the plurality of yokes individually away from and/or toward the elongated support bar in accordance with the automatically determined individual positions of each of the yokes, whereby the displacement has a perpendicular component with respect to the elongated support bar.

14. The magnetron sputtering apparatus according to claim 11, wherein the controller is configured to automatically determine a simulated coating profile for the substrate on the basis of the automatically determined individual positions of each of the plurality of yokes, and to display the simulated coating profile on a display.

15. The magnetron sputtering apparatus according to claim 11,
wherein at least one measured parameter is determined on the basis of at least one measurement performed on the substrate after the adjustment of the plurality of yokes,
wherein the controller is configured to automatically determine new individual positions of each of the plurality of yokes on the basis of the at least one measured parameter, and
wherein the actuating mechanisms are configured to individually adjust positions of each of the plurality of yokes in accordance with the new individual positions of each of the plurality of yokes.

16. The magnetron sputtering apparatus according to claim 11, wherein the at least one parameter is set automatically on the basis of the at least one measurement performed on the substrate.

* * * * *